United States Patent
Kuo

(10) Patent No.: US 8,179,687 B2
(45) Date of Patent: May 15, 2012

(54) SIGNAL TRANSMISSION DEVICE WITH SINGLE OUTPUT CONFIGURATION AND RELATED MOTHERBOARD

(75) Inventor: Hsin-Meng Kuo, Changhua County (TW)

(73) Assignee: Elitegroup Computer Systems Co., Ltd., Neihu District, Taipei (TW)

( * ) Notice: Subject to any disclaimer, the term of this patent is extended or adjusted under 35 U.S.C. 154(b) by 465 days.

(21) Appl. No.: 12/497,705

(22) Filed: Jul. 6, 2009

(65) Prior Publication Data
US 2010/0244996 A1    Sep. 30, 2010

(30) Foreign Application Priority Data

Mar. 24, 2009 (TW) ................................. 98204652 U

(51) Int. Cl.
H05K 7/02 (2006.01)
H05K 7/06 (2006.01)
H05K 7/08 (2006.01)
H05K 7/10 (2006.01)

(52) U.S. Cl. ......... 361/760; 361/763; 361/794; 361/795

(58) Field of Classification Search .......... 361/760–763, 361/782–784, 792–795; 333/4
See application file for complete search history.

(56) References Cited

U.S. PATENT DOCUMENTS

| | | | | |
|---|---|---|---|---|
| 6,097,402 A * | 8/2000 | Case et al. | ..................... | 345/543 |
| 6,346,946 B1 * | 2/2002 | Jeddeloh | ........................ | 345/503 |
| 6,514,065 B2 * | 2/2003 | Usui et al. | ..................... | 425/162 |
| 6,874,042 B2 | 3/2005 | Sauber | | |
| 7,598,823 B2 * | 10/2009 | Yeh | .................................. | 333/4 |
| 2007/0257807 A1 * | 11/2007 | Darr | .............................. | 340/635 |

* cited by examiner

*Primary Examiner* — Tuan T Dinh

(74) *Attorney, Agent, or Firm* — Winston Hsu; Scott Margo

(57) ABSTRACT

A signal transmission device is installed on a motherboard and is electrically connected to a signal control unit and a display output interface. The signal transmission device includes a signal receiving port, a signal output port, and a printed circuit connecting port. The signal receiving port is used for receiving a signal transmitted from the signal control unit. The signal output port is used for single output of the signal to the display output interface. The printed circuit connecting port is used for transmitting the signal from the signal receiving port to the signal output port. Thus, the signal transmission device may be used for single signal output so as to replace a switch integrated circuit of selective signal output. In such a manner, related circuit redesign and manufacturing cost may be reduced accordingly when the motherboard signal output design is changed from selective signal output to single signal output.

7 Claims, 7 Drawing Sheets

SIGNAL TRANSMISSION DEVICE WITH SINGLE OUTPUT CONFIGURATION AND RELATED MOTHERBOARD

BACKGROUND OF THE INVENTION

1. Field of the Invention

The present invention relates to a signal transmission device and a related motherboard, and more specifically, to a signal transmission device with single output configuration and a related motherboard.

2. Description of the Prior Art

With rapid development of electronic technology, a computer has powerful and various functions, such as data storage, video display, optical disk recording, and so on. Thus, the related component configuration on a motherboard becomes more complicated and more flexible, meaning that a user may have various choices in component assembly of the computer. For example, in connection of a computer screen to a computer host, a common assembly method utilizes insertion of a signal plug of the computer screen into a signal socket of a graphics processing card installed on a motherboard for driving the computer screen to display images based on signals transmitted from the computer host. But if the motherboard simultaneously has a digital visual interface (DVI) connecting port and a graphics processing card slot (e.g. a PCI-E bus), a user may have two assembly choices. One assembly choice, as mentioned above, is to utilize connection of the signal socket on the graphics processing card installed in the graphics processing card slot to the signal plug of the computer screen for signal transmission and image display. Another assembly choice is to utilize the signal plug to insert into the digital visual interface connecting port instead when the graphics processing card is not installed in the graphics processing card slot.

In general, if a motherboard has different signal input/output devices, a switch integrated circuit is usually installed on the motherboard for path control of signal transmission. The said signal transmission design is commonly seen in the prior art. For example, U.S. Pat. No. 6,874,042 discloses that a switch integrated circuit is utilized for path control of signal transmission between different devices. With reference to claim 1 and FIG. 3 provided by U.S. Pat. No. 6,874,042, a switch integrated circuit installed on a graphics processing card is utilized for path control of signal transmission between the graphics processing card and computer peripheral devices. The aforementioned component configuration may also be applied to a motherboard that simultaneously has a digital display connecting port and a graphics processing card slot. Please refer to FIG. 1, which is a diagram of a motherboard 10 according to the prior art. The motherboard 10 includes a signal control unit 12, a graphics processing card slot 14, a visual interface connecting port 16, and a switch integrated circuit 18. The switch integrated circuit 18 is connected to the signal control unit 12, the graphics processing card slot 14, and the visual interface connecting port 16. If the switch integrated circuit 18 determines that a graphics processing card is installed in the graphics processing card slot 14, the switch integrated circuit 18 transmits image signals received from the signal control unit 12 to the graphics processing card via the graphics processing card slot 14 for further signal processing. On the other hand, if the switch integrated circuit 18 determines that a graphics processing card is not installed in the graphics processing card slot 14, the switch integrated circuit 18 may transmit image signals received from the signal control unit 12 to the visual interface connecting port 16 instead. In such a manner, the motherboard 10 may utilize the switch integrated circuit 18 to achieve the purpose of selective signal output, so as to provide a user with a flexible computer peripheral component assembly.

However, as electronic products increasingly become lighter, thinner, shorter, and smaller, a single output configuration for signals is commonly used in a motherboard recently. That is, a signal output design for a motherboard is changed from a component configuration in which a visual interface connecting port and a graphics processing card slot are simultaneously installed on the motherboard to a component configuration in which only one visual interface connecting port or one graphics processing card slot is installed on the motherboard, so that the manufacturing cost of the motherboard may be reduced. In summary, in single output design for a motherboard, a switch integrated circuit used for selective signal output is unnecessary, since it may increase the manufacturing cost of the motherboard and cause a complicated circuit configuration on the motherboard. However, removal of a switch integrated circuit from a motherboard may also introduce a redesign for the circuit configuration on the motherboard, so that extra manufacturing and research cost may occur.

SUMMARY OF THE INVENTION

The present invention provides a signal transmission device with single output configuration, installed on a motherboard and electrically connected to a signal control unit on the motherboard and a display output interface, the signal transmission device comprising a signal receiving port for receiving a signal transmitted from the signal control unit; a signal output port for single output of the signal to the display output interface; and a printed circuit connecting port electrically connected to the signal receiving port and the signal output port, the printed circuit connecting port used for transmitting the signal from the signal receiving port to the signal output port.

The present invention further provides a motherboard for single output of signals, the motherboard comprising a signal control unit for outputting a signal; a display output interface for receiving the signal and outputting the signal to a display device; and a signal transmission device electrically connected to the signal control unit and the display output interface, the signal transmission device comprising a signal receiving port for receiving the signal transmitted from the signal control unit; a signal output port for single output of the signal to the display output interface; and a printed circuit connecting port electrically connected to the signal receiving port and the signal output port, the printed circuit connecting port used for transmitting the signal from the signal receiving port to the signal output port.

These and other objectives of the present invention will no doubt become obvious to those of ordinary skill in the art after reading the following detailed description of the preferred embodiment that is illustrated in the various figures and drawings.

DETAILED DESCRIPTION

The best mode for carrying out the present invention will be described in detail below with reference to FIGS. 2, 3, 4, 5, and 7.

Figure 1:
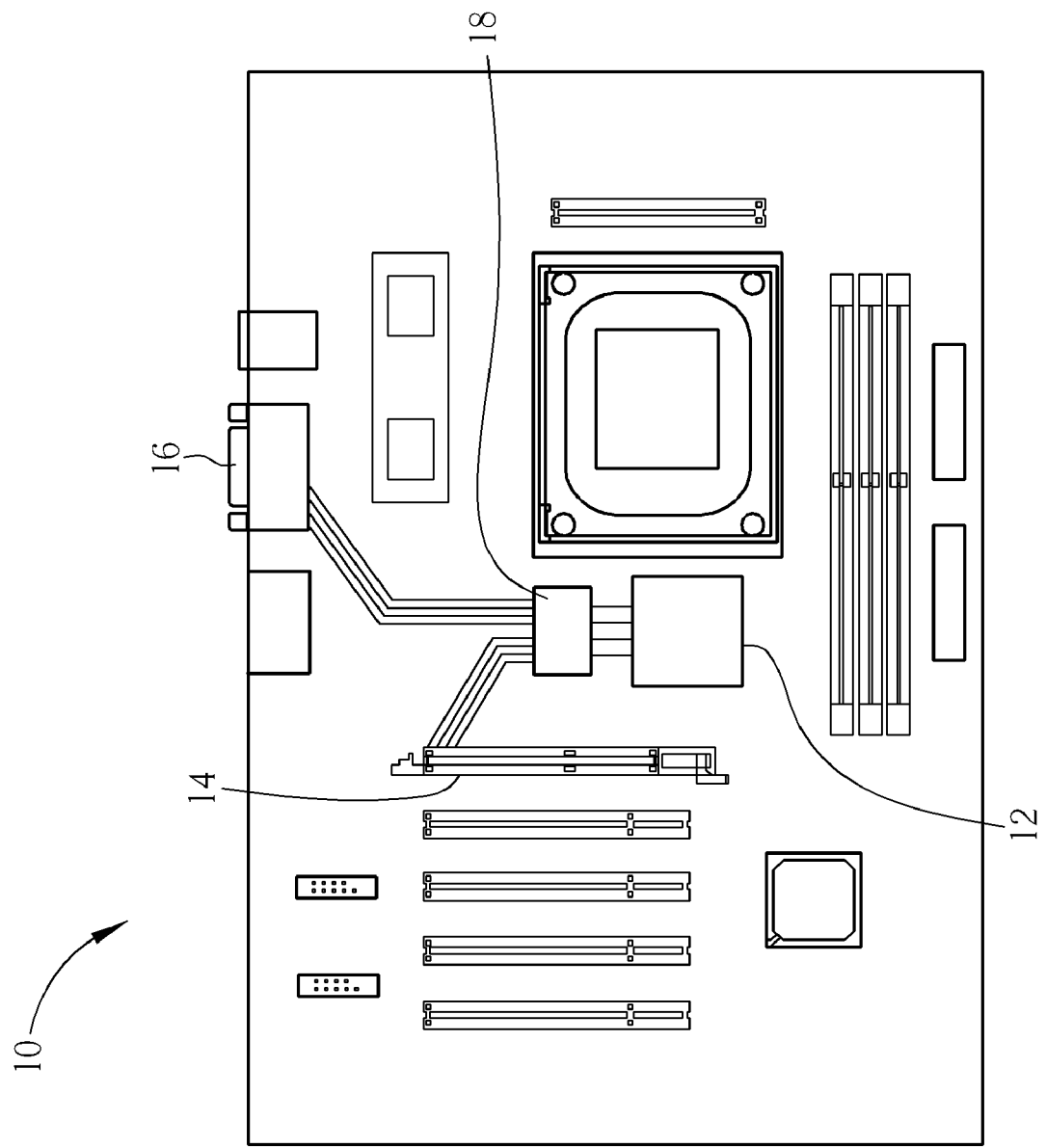
FIG. 1 is a diagram of a motherboard according to the prior art.
Figure 2:
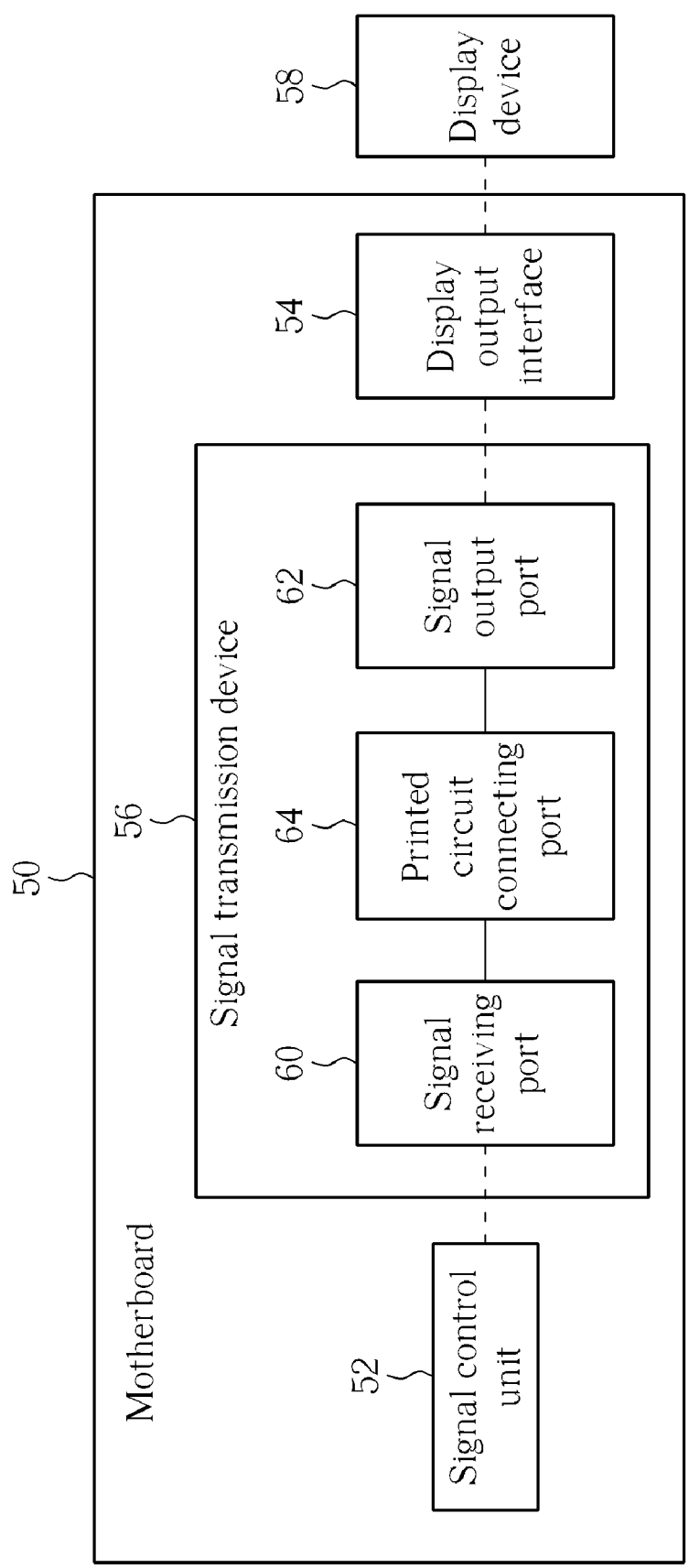
FIG. 2 is a functional block diagram of a motherboard according to a best-mode embodiment of the present invention.
Figure 3:
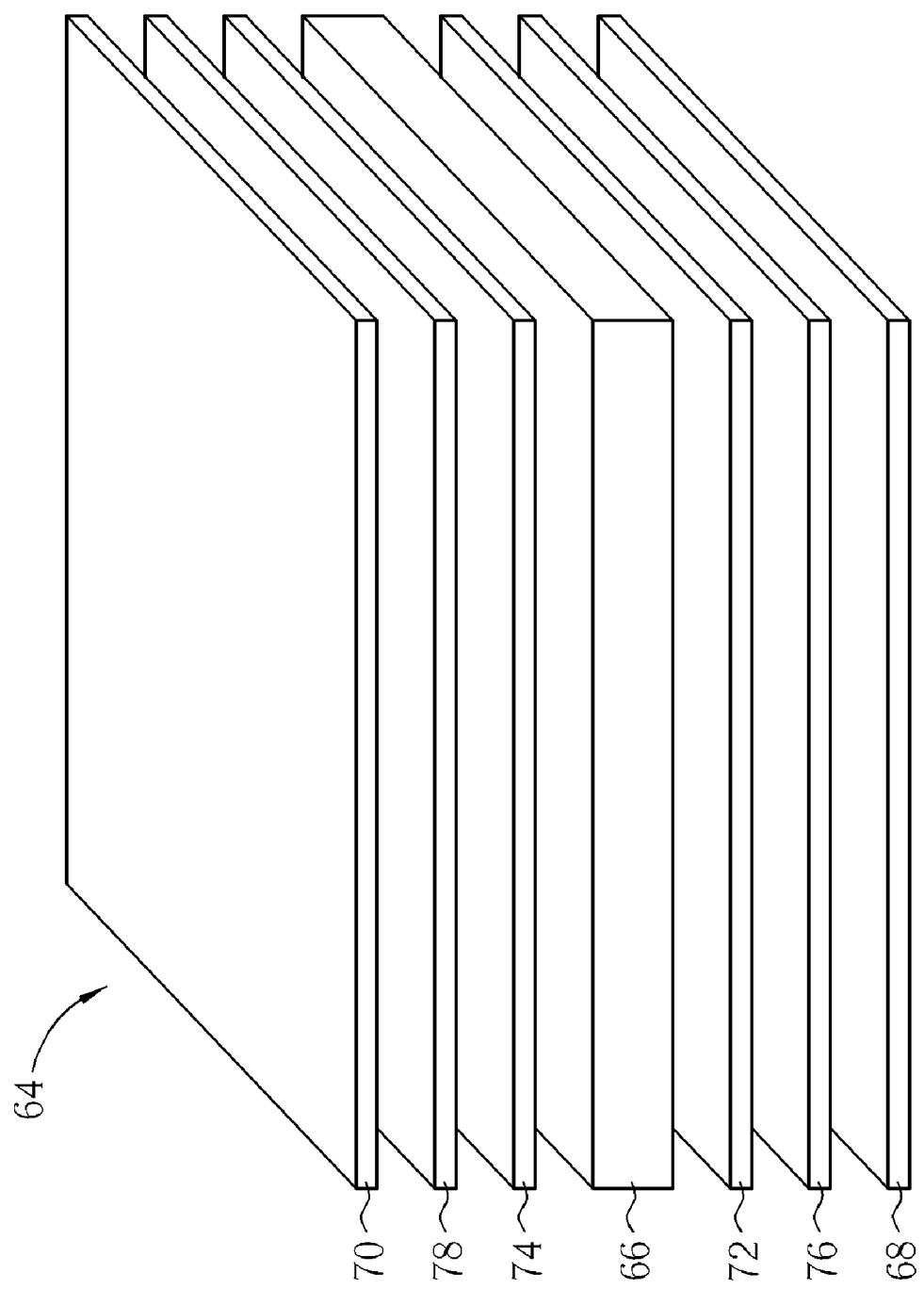
FIG. 3 is an exploded diagram of the printed circuit connecting port in FIG. 2 according to the best-mode embodiment of the present invention.

Please refer to FIG. 2, which is a functional block diagram of a motherboard 50 according to a best-mode embodiment of the present invention. The motherboard 50 includes a signal control unit 52, a display output interface 54, and a signal transmission device 56. The signal control unit 52 is used for outputting a signal, which is preferably a video signal. In this embodiment, the signal control unit 52 may be a signal processor commonly installed on a motherboard, such as a graphics memory controller hub (GMCH). The display output interface 54 is used for receiving the signal and transmitting the signal to a display device 58, so that the display device 58 may display corresponding images according to the signal. The display device 58 may be a display apparatus commonly installed in a computer host, such as an LCD (Liquid Crystal Display) screen. The display output interface 54 may preferably be a digital display connecting port, such as a digital video interface connecting port, an HDMI (High Definition Multimedia Interface) connecting port, and so on; or a graphics processing card slot, such as a PCI-E (Peripheral Component Interconnect-Express) bus. As to which connecting interface is utilized in the present invention, it depends on practical application needs for the motherboard 50. Next, as shown in FIG. 2, the signal transmission device 56 is electrically connected to the signal control unit 52 and the display output interface 54 for signal transmission between the signal control unit 52 and the display output interface 54. The signal transmission device 56 includes a signal receiving port 60, a signal output port 62, and a printed circuit connecting port 64. The signal receiving port 60 is used for receiving the signal transmitted from the signal control unit 52. The signal output port 62 is used for single output of the signal to the display output interface 54. Furthermore, the printed circuit connecting port 64 is electrically connected to the signal receiving port 60 and the signal receiving port 62. The printed circuit connecting port 64 is used for transmitting the signal from the signal receiving port 60 to the signal output port 62.

In the following, more detailed description for the configuration of the printed circuit connecting port 64 is provided. Please refer to FIG. 3, which is an exploded diagram of the printed circuit connecting port 64 in FIG. 2 according to the best-mode embodiment of the present invention. The printed circuit connecting port 64 includes a base board 66, a first signal transmission layer 68, a second signal transmission layer 70, a ground layer 72, a power supply layer 74, and isolation layers 76, 78. In this embodiment, the printed circuit connecting port 64 may preferably be a four-layer printed circuit board. The thickness of the four-layer printed circuit board is substantially equal to 59 mil, and the resistance of the four-layer printed circuit board is substantially equal to 85Ω. The thickness of the base board 66 is substantially equal to 47 mil. Furthermore, the first signal transmission layer 68 is disposed at a side of the base board 66, and the second signal transmission layer 70 is disposed at another side of the base board 66 opposite to the first signal transmission layer 68. The signal transmission layer 68 and the second transmission layer 70 are used for transmission of the signal. The ground layer 72 is disposed between the base board 66 and the first signal transmission layer 68 for ground connection. The power supply layer 74 is disposed between the base board 66 and the second signal transmission layer 70. The power supply layer 74 is used for providing the four-layer printed circuit board with electrical power. Finally, the isolation layers 76, 78 are disposed between the first signal transmission layer 68 and the ground layer 72 and between the second signal transmission 70 and the power supply layer 74, respectively. According to the physical parameter setup and the layer configuration, which are mentioned above, the signal transmitted from the signal control unit 52 has a better transmission efficiency in the first signal transmission layer 68 and the second signal transmission layer 70 of the four-layer printed circuit board. However, the thickness/resistance setup and the internal layer configuration of the four-layer printed circuit board may not be limited to the said embodiment, meaning that it may vary with different application needs for the four-layer printed circuit board.

Figure 4:
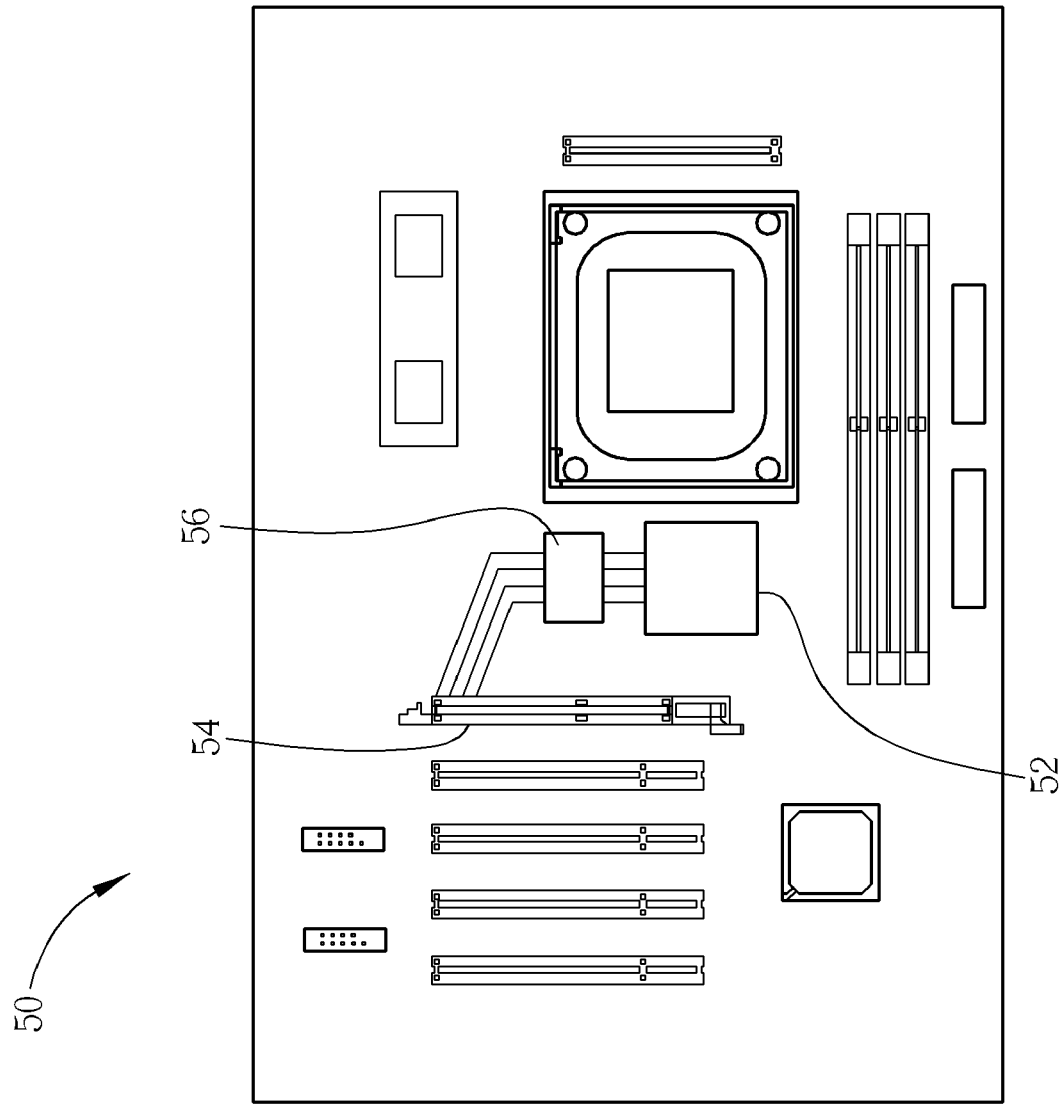
FIG. 4 is a diagram of the display output interface in FIG. 2 being a graphics processing card slot according to the best-mode embodiment of the present invention.
Figure 5:
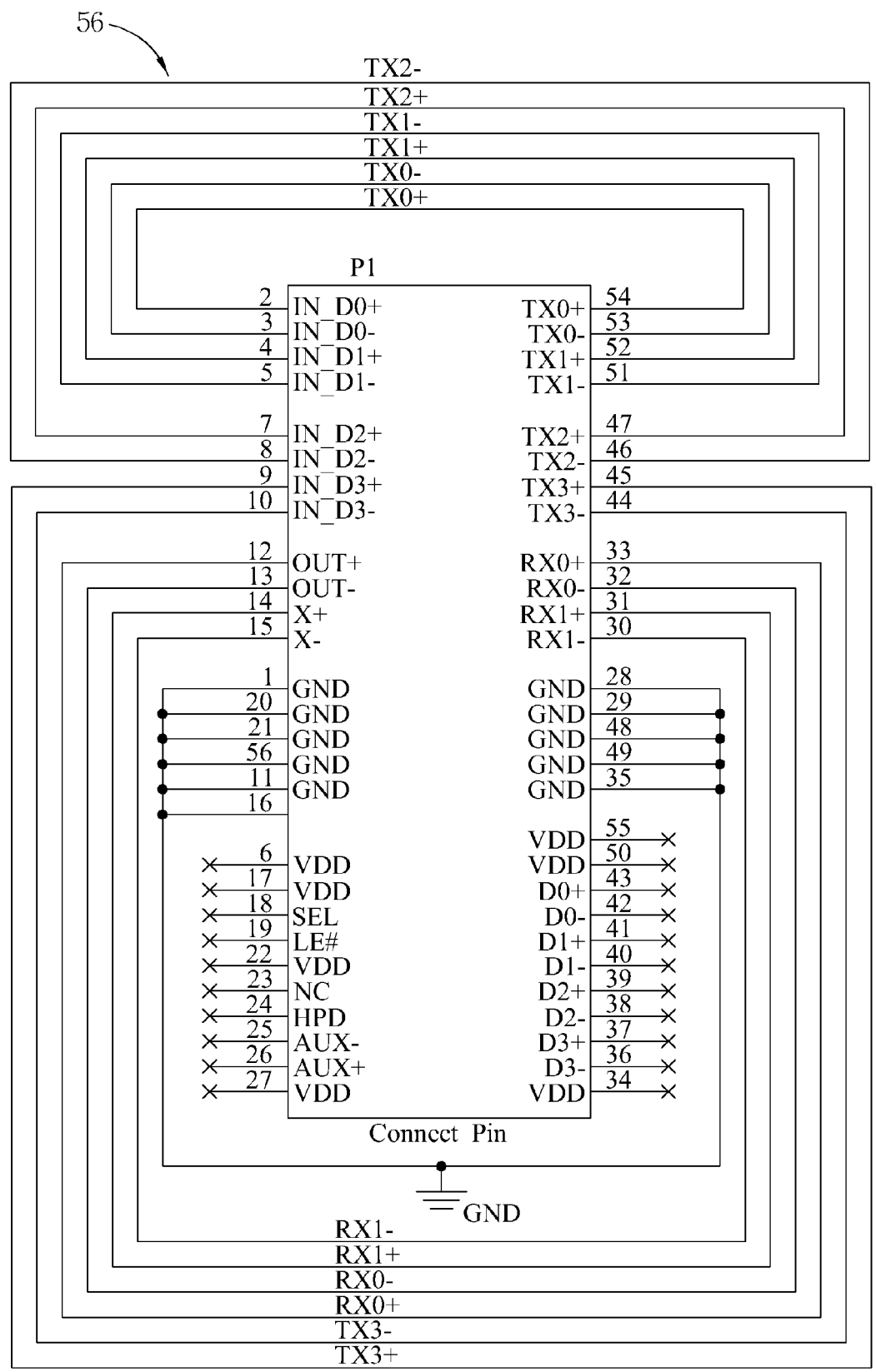
FIG. 5 is a circuit connection diagram of the signal transmission device in FIG. 2 according to the best-mode embodiment of the present invention.

Next, the signal transmission process of the motherboard 50 is particularly described for a condition in which the display output interface 54 is a graphics processing card slot and the signal is a video signal. Please refer to FIG. 2, FIG. 3, FIG. 4, and FIG. 5 at the same time. FIG. 4 is a diagram of the display output interface 54 in FIG. 2 being a graphics processing card slot according to the best-mode embodiment of the present invention. FIG. 5 is a circuit connection diagram of the signal transmission device 56 in FIG. 2 according to the best-mode embodiment of the present invention. When the signal control unit 52 generates a video signal, the signal control unit 52 may transmit the video signal to the signal receiving port 60 of the signal transmission device 56 via the circuit connection with the signal transmission device 56 (as shown in FIG. 5). Subsequently, the signal receiving port 60 may transmit the video signal to the printed circuit connecting port 64. As mentioned above, the printed circuit connecting port 64 may utilize its internal circuit transmission layer to transmit the video signal. That is, the printed circuit connecting port 64 may utilize the first signal transmission layer 68 or the second signal transmission layer 70 to transmit the video signal to the signal output port 62. Subsequently, the video signal may only be transmitted to the display output interface 54 since the connection between the signal output port 62 and the display output interface 54 is the only path for the subsequent signal transmission. Finally, after the video signal is transmitted to the display device 58 by a graphics processing card installed on the display output interface 54, the display device 58 may display corresponding images based on the video signal.

Figure 6:
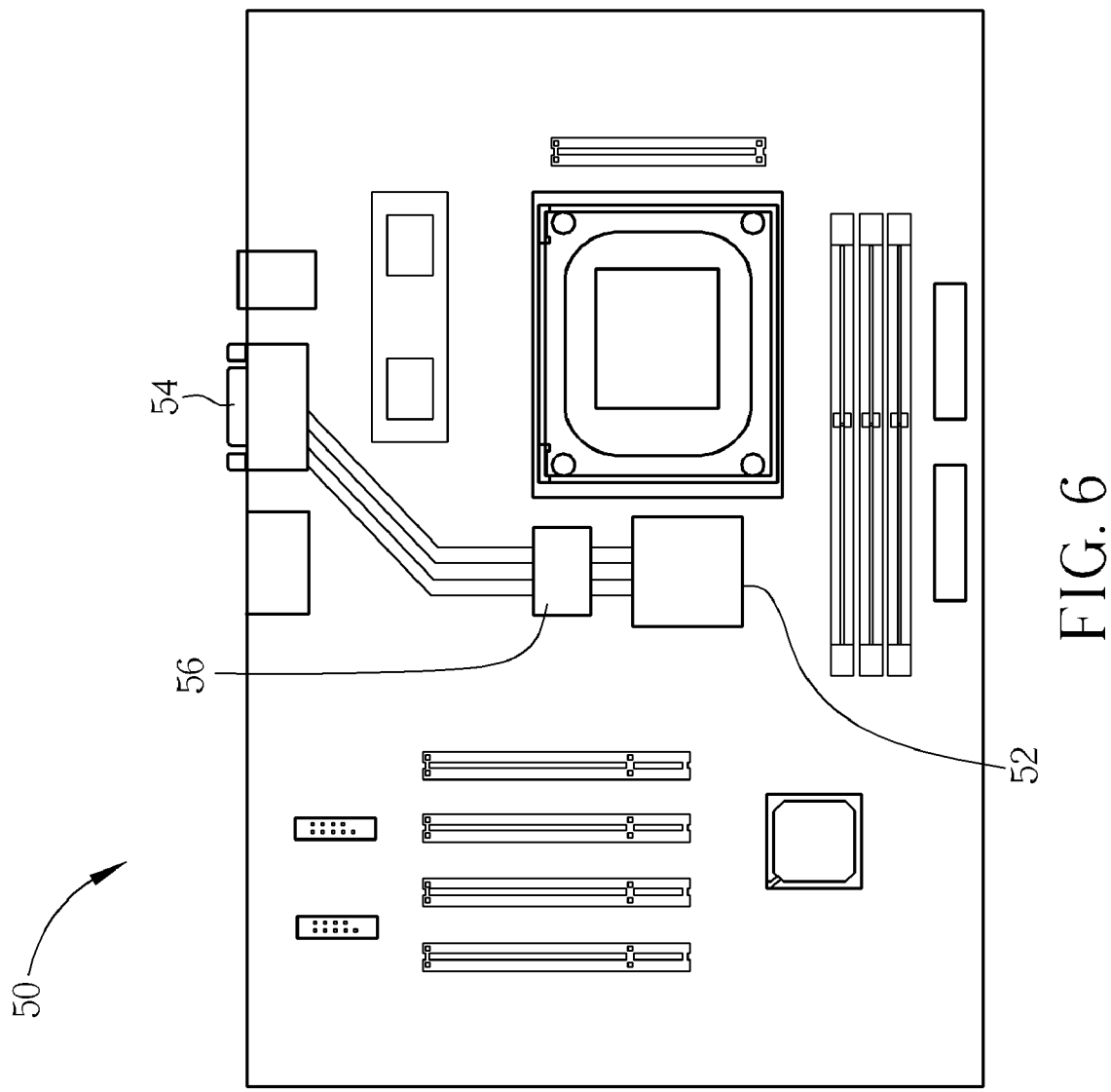
FIG. 6 is a diagram of the display output interface in FIG. 2 being a digital display connecting port according to another preferred embodiment of the present invention.

Next, please refer to FIG. 6, which is a diagram of the display output interface 54 in FIG. 2 being a digital display connecting port according to another preferred embodiment of the present invention. Similarly, single output of a video signal generated by the signal control unit 52 to the display output interface 54 may also be performed by the signal transmission device 56. Finally, after the display output interface 54 outputs the video signal to the display device 58, the display device 58 may display corresponding images based on the video signal. Since the signal transmission process is the same as that mentioned in the above embodiment, the related description is therefore omitted herein. Application of the signal transmission device 56 is not limited to the said video signal transmission. In other words, by circuit connection of the signal transmission device 56 to the signal control unit 52 and the display output interface 54, the motherboard 50 may also perform single output of other type of signal, such as a control signal for the motherboard 50.

Figure 7:
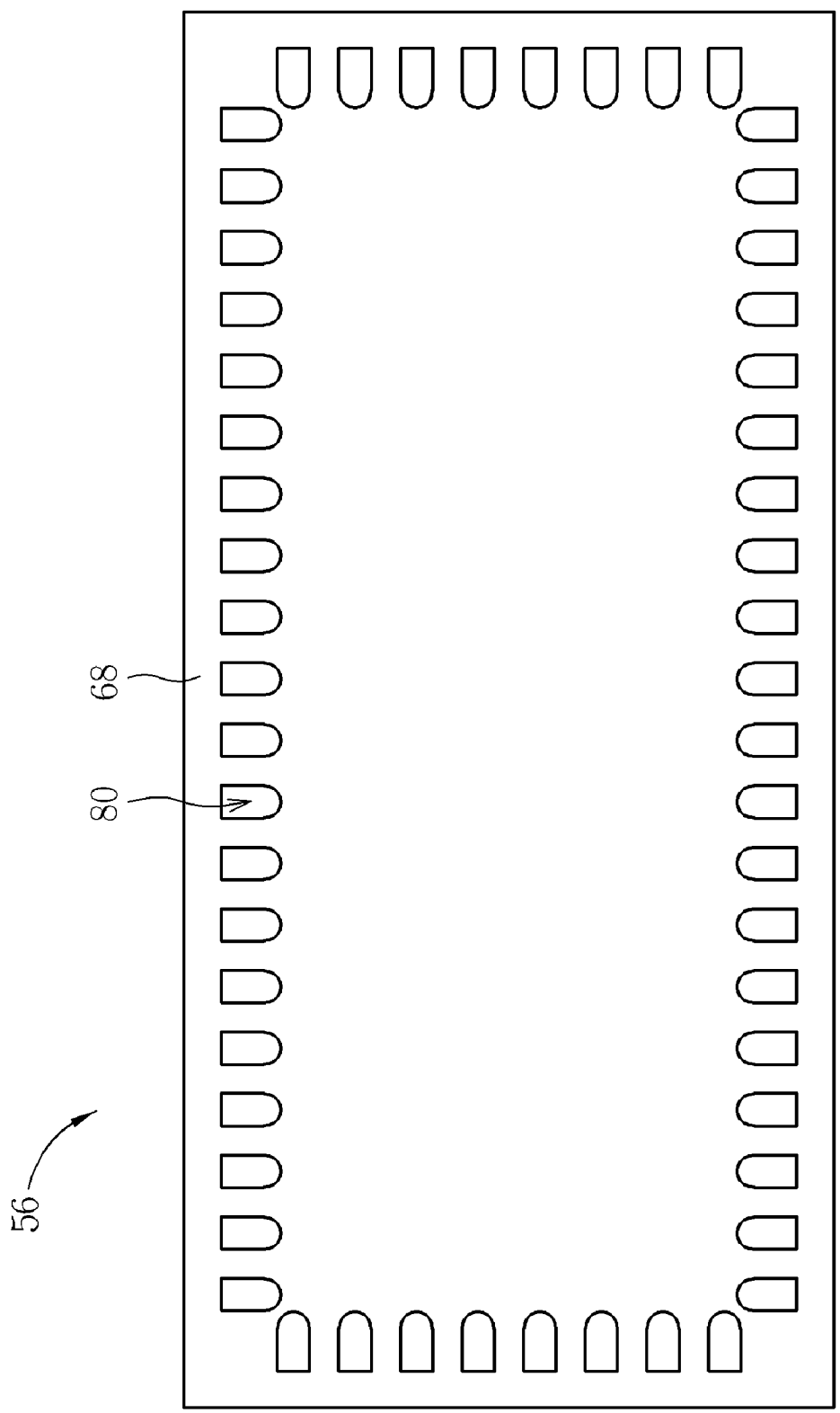
FIG. 7 is a bottom view of the signal transmission device in FIG. 2 according to the best-mode embodiment of the present invention.

Furthermore, please refer to FIG. 7, which is a bottom view of the signal transmission device 56 in FIG. 2 according to the best-mode embodiment of the present invention. As shown in FIG. 7, a plurality of contact pins 80 is disposed on the first signal transmission layer 68. Both the signal receiving port 60 and the signal output port 62 include at least one contact pin 80. The contact pin 80 on the signal receiving port 60 is used for receiving signals, and the contact pin 80 on the signal output port 62 is used for outputting signals. It should be noted that each contact pin 80 is disposed on the first signal transmission layer 68 in a manner of being at a specific distance from an edge of the first signal transmission layer 68. In such a manner, even if a cutting path control error occurs during the related cutting process for the signal transmission device 56, the probability of damage to each contact pin 80 may be reduced considerably due to the said configuration.

In summary, the motherboard of the present invention may utilize the signal transmission device electrically connected to the signal control unit and the display output interface to achieve the purpose of single output of the signal. In other words, if a motherboard utilizes a display output interface as only one output interface for signal transmission, the signal transmission device provided by the present invention may be used for replacing the aforementioned switch integrated circuit used for selective signal output. Since the specification and the internal circuit configuration of the signal transmission device is similar to that of the switch integrated circuit, the signal transmission device is capable of being installed in a position where the switch integrated circuit is originally installed. In such a manner, without a redesign for the circuit configuration on the motherboard, the purpose of single output for the signal may still be achieved by installation of the signal transmission device on the motherboard. Thus, compared with the prior art, the component cost of the motherboard may be reduced according to the present invention. Furthermore, considerable cost for the circuit redesign and manufacturing of the motherboard, which occurs when the motherboard signal output design is changed from selective signal output to single output for the signal, may also be saved.

Those skilled in the art will readily observe that numerous modifications and alterations of the device and method may be made while retaining the teachings of the invention.

What is claimed is:

1. A signal transmission device with single output configuration, installed on a motherboard and electrically connected to a signal control unit on the motherboard and a display output interface, the signal transmission device comprising:
   a signal receiving port for receiving a signal transmitted from the signal control unit;
   a signal output port for single output of the signal to the display output interface; and
   a printed circuit connecting port electrically connected to the signal receiving port and the signal output port, the printed circuit connecting port used for transmitting the signal from the signal receiving port to the signal output port;
   wherein the printed circuit connecting port comprises:
   a base board;
   a first signal transmission layer disposed at a first side of the base board;
   a second signal transmission layer disposed at a second side of the base board;
   a ground layer disposed between the base board and the first signal transmission layer, the ground layer used for ground connection; and a power supply layer disposed between the base board and the second signal transmission layer, the power supply layer used for providing power.

2. The signal transmission device of claim 1, wherein the signal is a video signal.

3. The signal transmission device of claim 1, wherein the printed circuit connecting port is a multilayer printed circuit board, and the thickness of the four-layer printed circuit board is substantially equal to 59 mil.

4. The signal transmission device of claim 1, wherein the thickness of the base board is substantially equal to 47 mil.

5. The signal transmission device of claim 1, wherein the printed circuit connecting port further comprises two isolation layers respectively disposed between the first signal transmission layer and the ground layer and between the second signal transmission layer and the power supply layer.

6. The signal transmission device of claim 1, wherein both the signal receiving port and the signal output port comprise at least one contact pin disposed on the first signal transmission layer in a manner of being at a specific distance from an edge of the first signal transmission layer.

7. The signal transmission device of claim 3, wherein the resistance of the multilayer printed circuit board is substantially equal to 85Ω.

* * * * *